United States Patent
Lai et al.

(10) Patent No.: US 7,589,593 B2
(45) Date of Patent: Sep. 15, 2009

(54) AMPLIFIER CIRCUIT HAVING STACKED MAIN AMPLIFIER AND PARALLEL SUB-AMPLIFIER

(75) Inventors: Jie-Wei Lai, Taipei (TW); Min Chen, Fremont, CA (US)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/022,159

(22) Filed: Jan. 30, 2008

(65) Prior Publication Data
US 2009/0189695 A1   Jul. 30, 2009

(51) Int. Cl.
H03F 3/04   (2006.01)
H03F 1/22   (2006.01)

(52) U.S. Cl. ....................... 330/295; 330/311
(58) Field of Classification Search .................. 330/295, 330/310, 311
See application file for complete search history.

(56) References Cited

U.S. PATENT DOCUMENTS

| | | | |
|---|---|---|---|
| 6,556,085 B2 | 4/2003 | Kwon | |
| 7,193,475 B2 | 3/2007 | Su | |
| 7,352,247 B2 * | 4/2008 | Oh et al. | 330/311 |
| 2006/0170502 A1 * | 8/2006 | Cha et al. | 330/295 |

OTHER PUBLICATIONS

JSSC, vol. 39, No. 2, 2004, pp. 275.
JSSC, vol. 42, No. 2, 2007, pp. 329.

* cited by examiner

*Primary Examiner*—Robert Pascal
*Assistant Examiner*—Khiem D Nguyen
(74) *Attorney, Agent, or Firm*—Winston Hsu

(57) ABSTRACT

An amplifier circuit for amplifying an input signal to generate an output signal is provided. The amplifier circuit has a stacked main amplifier, a parallel sub-amplifier, and a signal combiner. The stacked main amplifier includes a first amplifier unit for outputting a first amplified signal generated from processing the input signal; and a second amplifier unit for outputting a second amplified signal generated from processing the first amplified signal. The first amplifier unit and the second amplifier unit share bias current. The parallel sub-amplifier is coupled to the stacked main amplifier according to a parallel connection fashion, and outputs a third amplified signal generated from processing the input signal. The signal combiner combines the second amplified signal and the third amplified signal to generate the output signal.

12 Claims, 8 Drawing Sheets

AMPLIFIER CIRCUIT HAVING STACKED MAIN AMPLIFIER AND PARALLEL SUB-AMPLIFIER

BACKGROUND

The present invention related to an amplifier architecture, and more particularly, to an amplifier circuit having a stacked main amplifier and a parallel sub-amplifier to achieve low power, high gain, and low noise.

Amplifiers are common circuit components implemented in a variety of fields. Taking a wireless communication device for example, a low noise amplifier (LNA) is commonly used in an RF receiver for amplifying signals received from an antenna. If the wireless communication device is a portable device, a low power structure is demanded. However, the conventional low noise amplifier has high power consumption to achieve the desired power gain. Therefore, it is desired to provide a novel amplifier circuit with low power, high gain, and low noise to meet the design requirements for a portable apparatus.

SUMMARY

It is therefore one of the objectives of the present invention to provide an amplifier circuit having a stacked main amplifier and a parallel sub-amplifier to achieve low power, high gain, and low noise. According to an exemplary embodiment of the present invention, an amplifier circuit for amplifying an input signal to generate an output signal is provided. The amplifier circuit has a stacked main amplifier, a parallel sub-amplifier, and a signal combiner. The stacked main amplifier includes: a first amplifier unit, having an input node for receiving an input signal, and an output node for outputting a first amplified signal generated from processing the input signal; and a second amplifier unit, having an input node coupled to the output node of the first amplifier unit for receiving the first amplified signal, and an output node for outputting a second amplified signal generated from processing the first amplified signal. The first amplifier unit and the second amplifier unit share bias current. The parallel sub-amplifier has an input node coupled to the input node of the first amplifier unit for receiving the input signal, and an output node for outputting a third amplified signal generated from processing the input signal. The signal combiner is coupled to the output node of the second amplifier unit and the output node of the parallel sub-amplifier, and is configured for combining the second amplified signal and the third amplified signal to generate the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
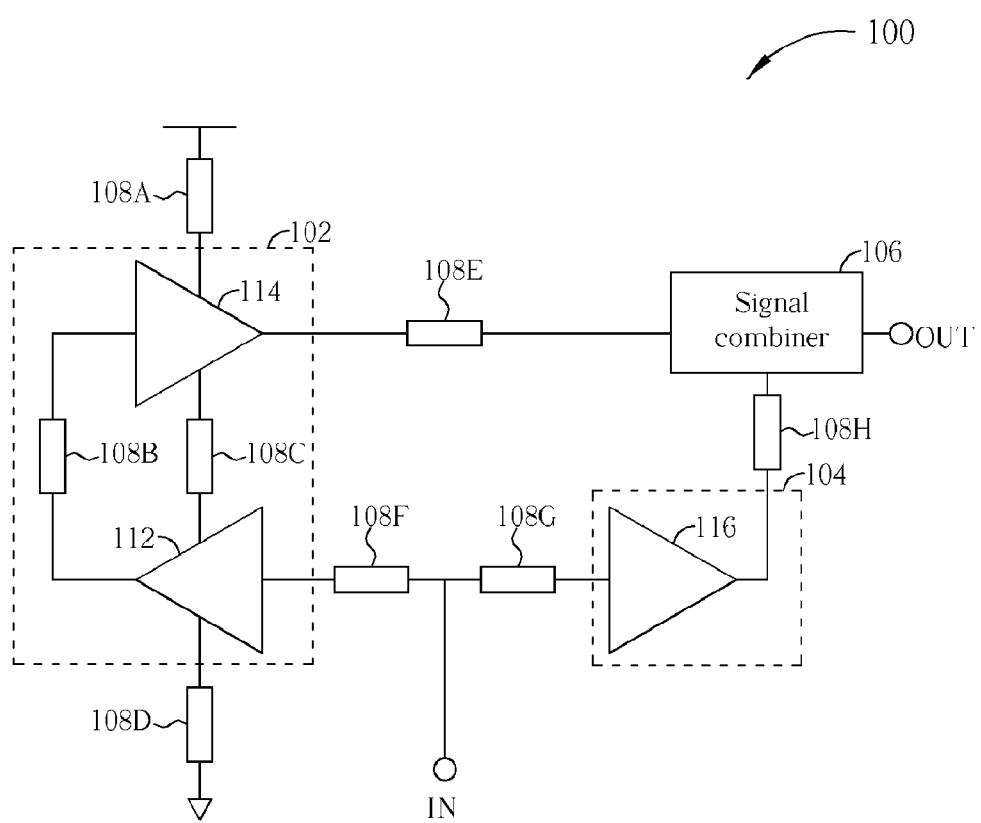
FIG. 1 is a block diagram illustrating a first exemplary amplifier architecture according to the present invention.

FIG. 1 is a block diagram illustrating a first exemplary amplifier architecture according to the present invention. In this embodiment, an amplifier circuit 100 includes, but is not limited to, a stacked main amplifier 102, a parallel sub-amplifier 104, and a signal combiner 106. Additionally, a plurality of coupling components 108A-108H for signal coupling purposes are shown in FIG. 1. The coupling components could be implemented using resistive elements, capacitive elements, inductive elements, transmission lines, or combinations thereof, depending upon design requirements. As the actual implementation of the coupling components is not pertinent to technical features of the present invention, further description is omitted here for the sake of brevity. Due to the coupling component 108B feeding an output of one amplifier unit 112 to another amplifier unit 114 and both amplifier unit 112 and amplifier unit 114 sharing the same bias current, the stacked main amplifier 102 therefore has low power and high gain. Assume that the amplifier unit 112 has a gain value equal to G1 and the amplifier unit 114 has a gain value equal to G2, an equivalent gain value of the overall stacked main amplifier 102 is equal to a direct multiplication of G1 and G2, i.e., G1×G2. The power consumption, however, is low due to bias current sharing (i.e., bias current reuse). The amplifier unit 112 serves as an input stage of the stacked main amplifier 102, and could be implemented using a common-gate (base) input stage configuration or common-source (emitter) input stage configuration, depending upon design requirements. The stacked main amplifier 102 is utilized for amplifying wanted signal received at the input node IN with low power operation. It should be noted that the hardware configuration of the stacked main amplifier 102 shown in FIG. 1 is for illustrative purposes only, and is not meant to be taken as a limitation of the present invention.

In the first embodiment, the parallel sub-amplifier 104 is not implemented using a stacked amplifier, and is configured to play an important role for suppressing noise originated from the amplifier unit 112 of the stacked main amplifier 102. In short, the parallel sub-amplifier 104 is coupled to the stacked main amplifier 102 in a parallel connection fashion, and is utilized for amplifying wanted signal received at the input node IN and also sensing noise interference from the amplifier unit 112 of the stacked main amplifier 102 for low noise operation.

The signal combiner 106 could be devised to combine voltages or currents according to outputs of the stacked main amplifier 102 and the parallel sub-amplifier 104. After combining outputs of the stacked main amplifier 102 and the parallel sub-amplifier 104, a desired amplified signal with low noise is generated and outputted from the output node OUT. It should be noted that the signal combiner 106 should be well configured to achieve the noise suppression objective. For example, in order to suppress noise originated from the amplifier unit 112, the signal combiner 106 should be well configured to add the output of the parallel sub-amplifier 104 to the output of the stacked main amplifier 102 or subtract the output of the parallel sub-amplifier 104 from the output of the stacked main amplifier 102 according to actual designs of the stacked main amplifier 102 and the parallel sub-amplifier 104. Certain examples are illustrated as below.

Figure 2:
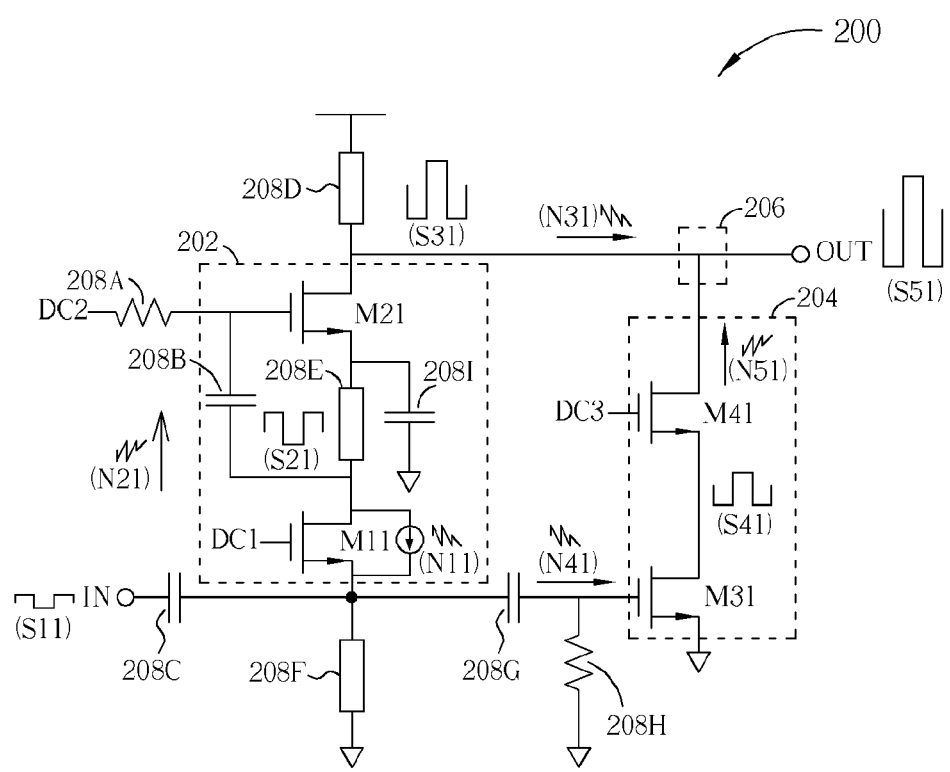
FIG. 2 is a circuit diagram illustrating an amplifier circuit having a stacked main amplifier with common-gate input stage according to a first embodiment of the present invention.

Please refer to FIG. 2. FIG. 2 is a circuit diagram illustrating an amplifier circuit having a stacked main amplifier with common-gate input stage according to a first embodiment of the present invention. In this embodiment, the amplifier circuit 200 includes, but is not limited to, a stacked main amplifier 202, a parallel sub-amplifier 204, and a signal combiner 206. In addition, a plurality of coupling components 208A-208I are implemented for signal coupling purposes, except 208D and 208E for load purposes. The stacked main amplifier 202 includes two transistors M11 and M21 biased by bias voltages DC1 and DC2 respectively, where the stacked main amplifier 202 has a common-gate input stage configuration. The parallel sub-amplifier 204 includes two transistors M31 and M41, where the transistor M41 is biased by a bias voltage DC3. In this embodiment, the signal combiner 206 is directly implemented using interconnection of transmission lines coupled to outputs of the stacked main amplifier 202 and the parallel sub-amplifier 204 respectively. It should be noted that the hardware configuration shown in FIG. 2 is for illustrative purposes only, and is not meant to be taken as a limitation of the present invention. Provided that the result is substantially the same, adequate modifications made to the circuitry shown in FIG. 2 are possible.

When an input signal S11 is fed into the input node IN, the transistor M11 serves as a first amplifier unit and generates an amplified signal S21 according to the incoming input signal S11. Due to the coupling component 208B electrically connected between the drain of the transistor (NMOS transistor) M11 and the gate of the transistor (NMOS transistor) M21, the amplified signal S21 is further amplified by the transistor M21 serving as a second amplifier unit. As a result, the amplified signal S31 is generated from the transistor M21 by processing the amplified signal S21. Regarding the parallel sub-amplifier 204, the transistor (NMOS transistor) M31 receives the same input signal S11 at the gate, and then generates an amplified signal S41 according to the incoming input signal S11. It should be noted that due to characteristics of the transistors, the input signal S11 and the amplified signal S21 are in-phase; the amplified signals S21 and S31 are out of phase; and the input signal S11 and the amplified signal S41 are out of phase.

Suppose the noise signal originated from the transistor M11 is modeled by N11. A noise signal N21 flows to the gate of the transistor through the coupling component 208B. As a result, the transistor M21 outputs a noise signal N31 to the output node OUT due to the received noise signal N21. In addition, a noise signal N41 is delivered to the gate of the transistor M31 because the source of the transistor M11 is coupled to the gate of the transistor M31. As a result, the transistor outputs a noise signal N51 to the output node OUT. It should be noted that due to characteristics of transistors, the noise signals N11 and N21 are out of phase; the noise signals N21 and N31 are out of phase; the noise signals N11 and N41 are in-phase; and the noise signals N41 and N51 are out of phase.

As one can see, the noise signal N51 sensed by the parallel sub-amplifier 204 and the noise signal N31 outputted from the stacked main amplifier 202 are out of phase, and the amplified signal S31 outputted from the stacked main amplifier 202 and the amplified signal S41 outputted from the parallel sub-amplifier 204 are in-phase. Therefore, after all of the output signals, including the noise signals N31 and N51 and the amplified signals S31 and S41, are combined by the signal combiner 206, the noise signal N31 is suppressed by the noise signal N41, while the amplified signal S31 is boosted by the amplified signal S41 to generate a resultant output signal S51 at the output node OUT. Briefly summarized, the amplifier circuit 200 shown in FIG. 2 has high power gain and low power consumption due to the implementation of the stacked main amplifier 202, and additionally has low noise interference with the help of the implemented parallel sub-amplifier 204.

Figure 3:
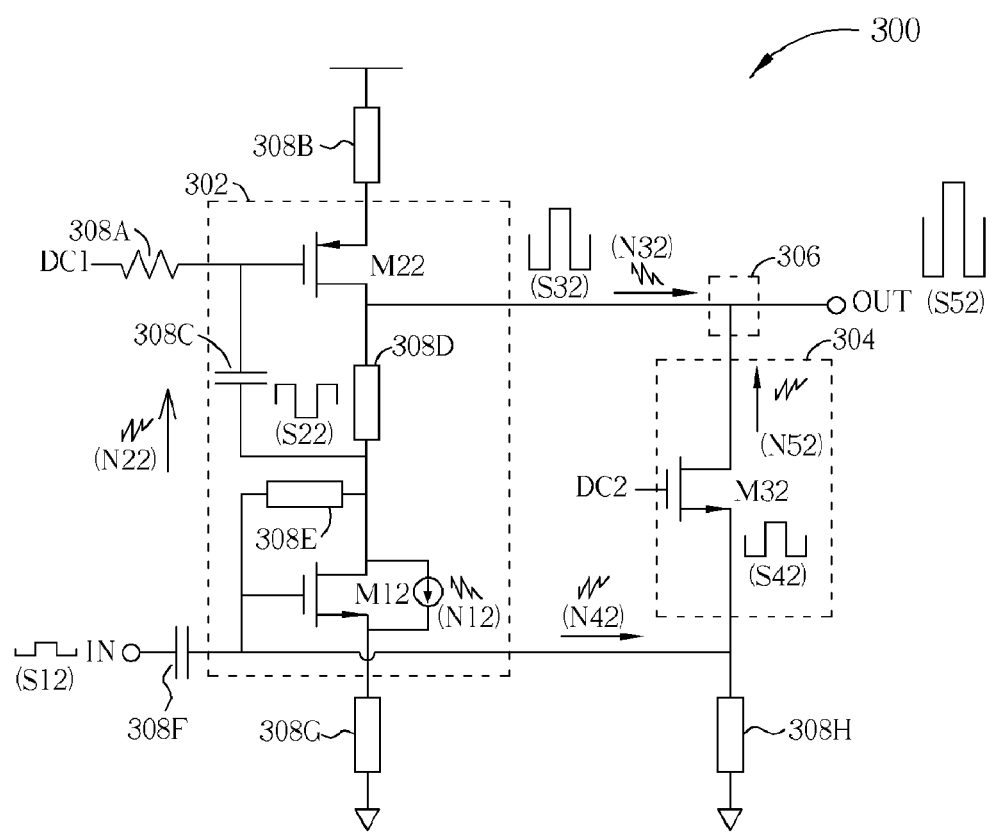
FIG. 3 is a circuit diagram illustrating an amplifier circuit having a stacked main amplifier with common-source input stage according to a second embodiment of the present invention.

Please refer to FIG. 3. FIG. 3 is a circuit diagram illustrating an amplifier circuit 300 having a stacked main amplifier with common-source input stage according to a second embodiment of the present invention. In this embodiment, the amplifier circuit 300 includes, but is not limited to, a stacked main amplifier 302, a parallel sub-amplifier 304, and a signal combiner 306. In addition, a plurality of coupling components 308A-308H are implemented for signal coupling purposes, except 308D for load purposes. The stacked main amplifier 302 includes two transistors M12 and M22, where the transistor M22 is biased by a bias voltage DC1. In addition, the stacked main amplifier 302 shown in FIG. 3 has a common-source input stage configuration. The parallel sub-amplifier 304 includes one transistor M32 biased by a bias voltage DC2. As shown in FIG. 3, the signal combiner 306 is directly implemented using interconnection of transmission lines coupled to outputs of the stacked main amplifier 302 and the parallel sub-amplifier 304 respectively. It should be noted that the hardware configuration shown in FIG. 3 is for illustrative purposes only, and is not meant to be taken as a limitation of the present invention. Provided that the result is substantially the same, adequate modifications made to the circuitry shown in FIG. 3 are possible.

When an input signal S12 is fed into the input node IN, the transistor (NMOS transistor) M12 serves as a first amplifier unit and generates an amplified signal S22 according to the incoming input signal S12 received at the gate. The amplified signal S22 is further amplified by the transistor (PMOS transistor) M22 serving as a second amplifier unit. As a result, the amplified signal S32 is generated from the transistor M22 by processing the received amplified signal S22. Regarding the parallel sub-amplifier 304, the transistor (NMOS transistor) M32 receives the same input signal S12 at the source, and then generates an amplified signal S42 according to the incoming input signal S12. As one can see, the input signal S12 and the amplified signal S22 are out of phase; the amplified signals S22 and S32 are out of phase; and the input signal S12 and the amplified signal S42 are in-phase due to characteristics of the transistors.

Suppose the noise signal originated from the transistor (NMOS transistor) M12 is modeled by N12. A noise signal N22 flows to the gate of the transistor (PMOS transistor) M22 through the coupling component 308C. As a result, the transistor M22 outputs a noise signal N32 to the output node OUT due to the received noise signal N22. In addition, a noise signal N42 is delivered to the drain of the transistor (NMOS transistor) M32 because the drain of the transistor M12 is coupled to the source of the transistor M32. As a result, the transistor M32 outputs a noise signal N52 to the output node OUT. As shown in FIG. 3, the noise signals N12 and N22 are out of phase; the noise signals N22 and N32 are out of phase; the noise signals N12 and N42 are out of phase; and the noise signals N42 and N52 are in-phase.

Similar to the embodiment shown in FIG. 2, the noise signal N52 sensed by the parallel sub-amplifier 304 and the noise signal N32 outputted from the stacked main amplifier 302 are out of phase, and the amplified signal S32 outputted from the stacked main amplifier 302 and the amplified signal S42 outputted from the parallel amplifier 304 are in-phase. Therefore, after all of the output signals, including the noise signals N32 and N52 and the amplified signals S32 and S42, are combined by the signal combiner 206, the noise signal N32 is suppressed by the noise signal N52, while the amplified signal S32 is boosted by the amplified signal S42 to generate a resultant output signal S52 at the output node OUT. Briefly summarized, the amplifier circuit 300 shown in FIG. 3 has high power gain and low power consumption due to the implementation of the stacked main amplifier 302, and additionally has low noise interference with the help of the implemented parallel sub-amplifier 304.

Figure 4:
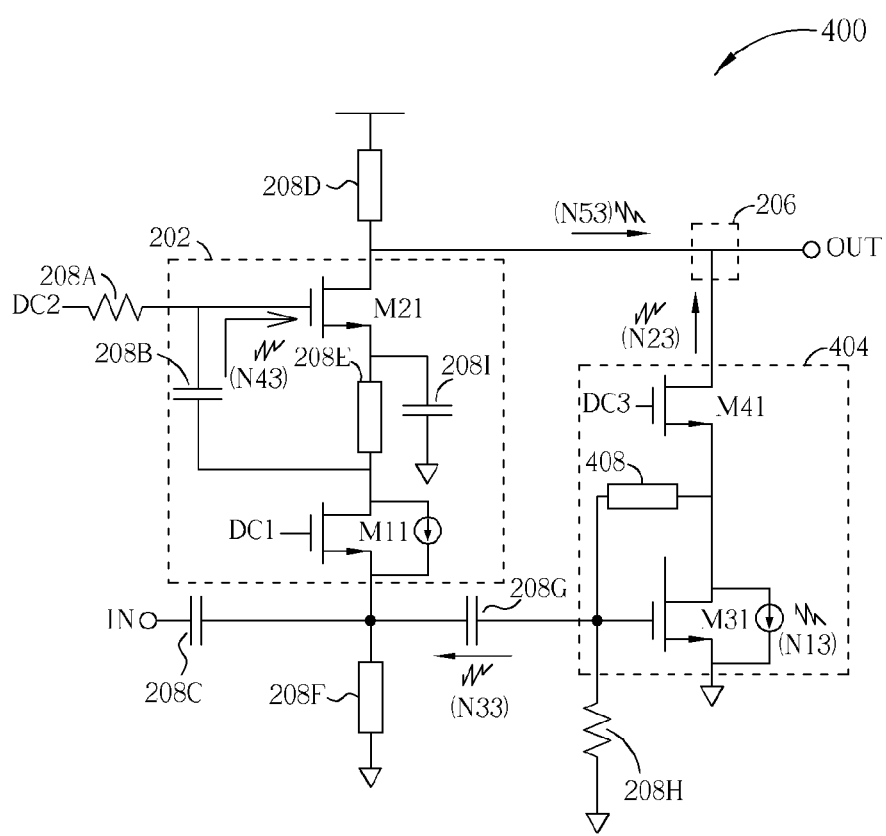
FIG. 4 is a circuit diagram illustrating an amplifier circuit having a stacked main amplifier with common-source input stage according to a third embodiment of the present invention.

Please refer to FIG. 4. FIG. 4 is a circuit diagram illustrating an amplifier circuit having a stacked main amplifier with common-source input stage according to a third embodiment of the present invention. In this embodiment, the amplifier circuit 400 includes, but is not limited to, a stacked main amplifier 202, a parallel sub-amplifier 404, and a signal combiner 206. In addition, a plurality of coupling components 208A-208I and 408 are implemented for signal coupling purposes, except 208D and 208E for load purpose. The amplifier circuit 400 shown in FIG. 4 is similar to the amplifier circuit 200 shown in FIG. 2. The difference is that the parallel sub-amplifier 404 has the coupling component 408 acting as a feedback component for feeding the noise signal originated from the transistor M31 to the stacked main amplifier 202. As a skilled person can readily understand the operation of using the parallel sub-amplifier 404 for noise suppression and the operation of using the stacked main amplifier 202 and the parallel sub-amplifier 404 to generate wanted amplified signals after reading above disclosure pertinent to the embodiment shown in FIG. 2, further description is omitted here for the sake of brevity. In the following, the operation of using the stacked main amplifier 202 for noise suppression of the noise signal originated from the transistor M31 of the parallel sub-amplifier 404 is detailed.

Suppose the noise signal originated from the transistor M31 is modeled by N13. A noise signal N33 is delivered to the source of the transistor (NMOS transistor) M11 because the drain of the transistor (NMOS transistor) M31 is coupled to the source of the transistor M11 through the feedback component (i.e., the coupling component 408). Next, a noise signal N43 is outputted to the gate of the transistor (NMOS transistor) M21 due to the noise signal N33 transmitted from the parallel sub-amplifier 404. After receiving the noise signal N43, the transistor M21 generates a noise signal N53 to the output node OUT. Regarding the parallel sub-amplifier 404, a noise signal N23 is delivered to the output node OUT due to the noise signal N13 originated from the transistor M31. It should be noted that the noise signals N13 and N23 are out of phase; the noises signals N13 and N33 are out of phase; the noise signals N33 and N43 are in-phase; and the noise signals N43 and N53 are out of phase. As the noise signal N23 induced at the output node OUT by the parallel sub-amplifier 404 and the noise signal N53 induced at the output node OUT by the stacked main amplifier 202 are out of phase, the noise signal N23 is suppressed by the noise signal N53 sensed by the stacked main amplifier 202. Briefly summarized, the amplifier circuit 400 employs dual noise suppression for suppression noise interference (e.g., shot noise) originated from the transistors M11 and M31.

In this embodiment, the coupling component 408 is implemented using a resistor. The resistance of the coupling component 408, however, determines the amount of noise interference fed to the stacked main amplifier 202. With proper setting of the resistance, optimum noise suppression performance of the overall amplifier circuit 400 could be achieved. Furthermore, the hardware configuration shown in FIG. 4 is for illustrative purposes only, and is not meant to be taken as a limitation of the present invention. Any modifications without departing from the spirit of the present invention can be made to the circuitry shown in FIG. 4.

Figure 5:
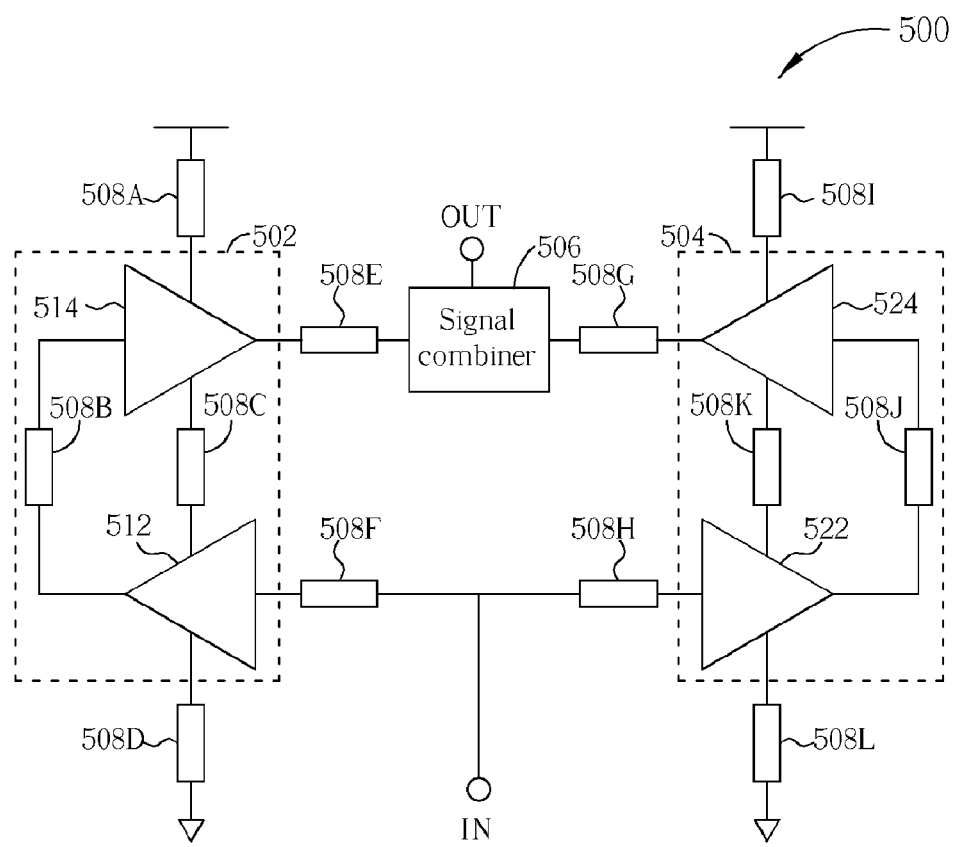
FIG. 5 is a block diagram illustrating a second exemplary amplifier architecture according to the present invention.

FIG. 5 is a block diagram illustrating a second exemplary amplifier architecture according to the present invention. In this embodiment, an amplifier circuit 500 includes, but is not limited to, a stacked main amplifier 502 having amplifier units 512 and 514; a parallel sub-amplifier 504 having amplifier units 522 and 524; and a signal combiner 506. Additionally, a plurality of coupling components 508A-108L for signal coupling purposes are shown in FIG. 5. The coupling components could be implemented using resistive elements, capacitive elements, inductive elements, transmission lines or combinations thereof, depending upon design requirements. The difference between the amplifier architectures shown in FIG. 1 and FIG. 5 is that the parallel sub-amplifier 504 is implemented using a stacked amplifier. In addition to sensing a noise signal for noise suppression, the parallel sub-amplifier 504 can amplified the wanted signal with high power gain and low power consumption. For clarity, an example is given as follows.

Figure 6:
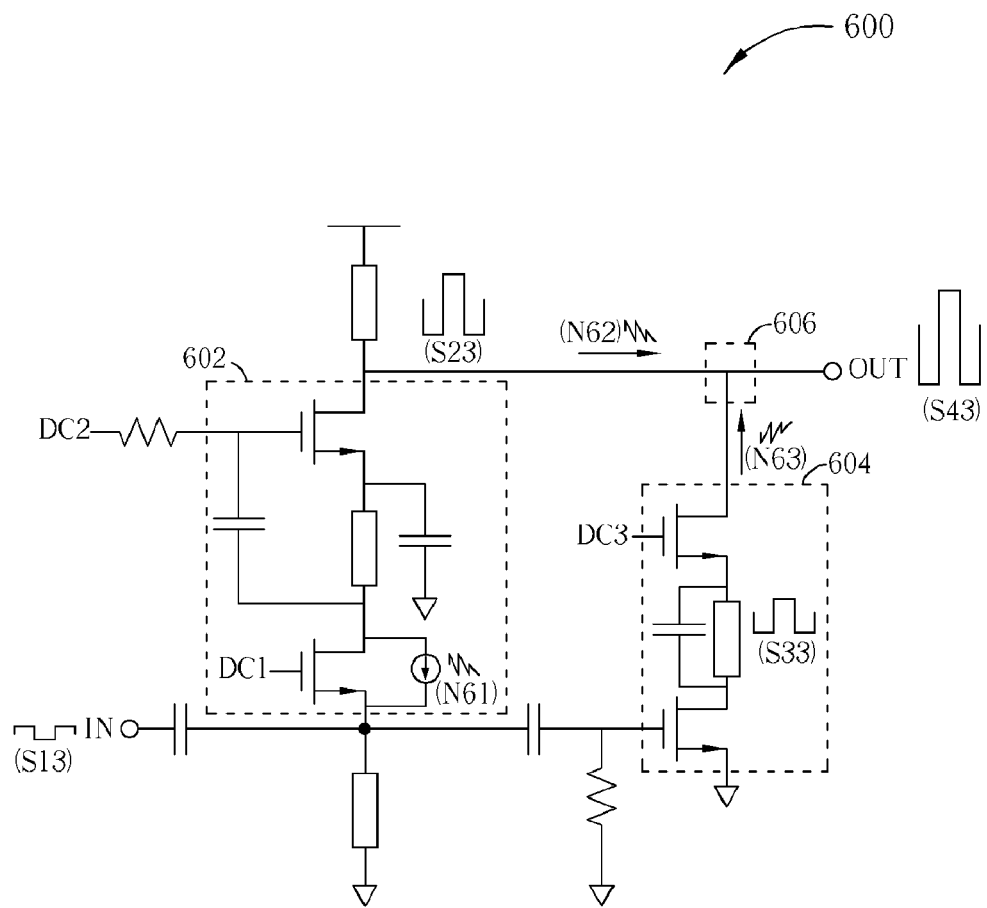
FIG. 6 is a circuit diagram illustrating an amplifier circuit having a stacked main amplifier and a stacked sub-amplifier according to a fourth embodiment of the present invention.

Please refer to FIG. 6. FIG. 6 is a circuit diagram illustrating an amplifier circuit having a stacked main amplifier and a stacked sub-amplifier according to a fourth embodiment of the present invention. The amplifier circuit 600 shown in FIG. 6 is similar to the amplifier circuit 200 shown in FIG. 6. The difference is the sub-amplifier implementation. In this embodiment, the sub-amplifier is implemented using a stacked sub-amplifier 604. Referring to aforementioned disclosure and the embodiment shown in FIG. 2, a skilled person can readily understand that the amplified signal S23 outputted from the stacked main amplifier 602 and the input signal S13 at the input node IN are in-phase; and the amplified signal S33 outputted from the stacked sub-amplifier 604 and the input signal S13 are in-phase as well. Additionally, the noise signal N61 and the noise signal N62 outputted from the stacked main amplifier 602 due to the noise signal N61 are in-phase, and the noise signal N61 and the sensed noise signal N63 outputted from the stacked sub-amplifier 604 due to the noise signal N61 are out of phase. In this embodiment, the signal combiner 606 is directly implemented using interconnection of transmission lines coupled to outputs of the stacked main amplifier 602 and the parallel stacked sub-amplifier 604 respectively. After combining the output signals, including the amplified signals S23 and S33 and the noise signals N62 and N63, the noise signal N62 is suppressed by the sensed noise signal N63, while the amplified signal S23 is boosted by the amplified signal S33 to generate a resultant output signal S43 at the output node OUT.

It should be noted that the hardware configuration shown in FIG. 6 is for illustrative purposes only, and is not meant to be taken as a limitation of the present invention. Any modifications without departing from the spirit of the present invention are allowed to be made to the circuitry shown in FIG. 6. For example, the stacked sub-amplifier can be applied to any amplifier circuit having a stacked main amplifier with common-gate input stage or common-source input stage. These alternative designs all fall in the scope of the present invention.

Figure 7:
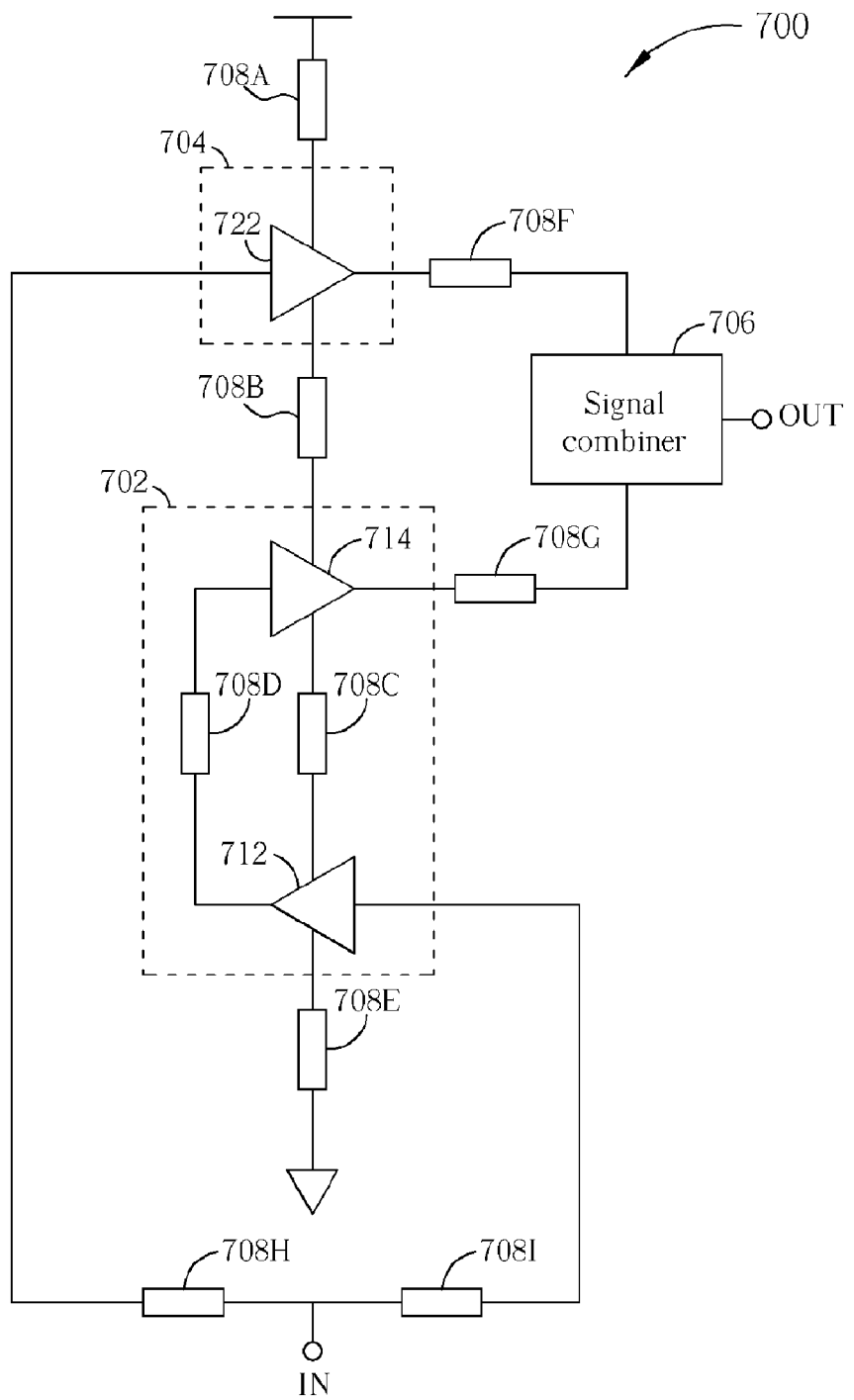
FIG. 7 is a block diagram illustrating a third exemplary amplifier architecture according to the present invention.

FIG. 7 is a block diagram illustrating a third exemplary amplifier architecture according to the present invention. In this embodiment, an amplifier circuit 700 includes, but is not limited to, a stacked main amplifier 702 having amplifier units 712 and 714; a parallel sub-amplifier 704 having an amplifier unit 722; and a signal combiner 706. Additionally, a plurality of coupling components 708A-708I for signal coupling purposes are shown in FIG. 7. The coupling components could be implemented using resistive elements, capacitive elements, inductive elements, transmission lines or combinations thereof, depending upon design requirements. Similar to the amplifier architecture in FIG. 1, the amplifier architecture shown in FIG. 7 delivers the signal received at the input node IN to both of the stacked main amplifier 702 and the parallel sub-amplifier 704, and uses the signal combiner 706 to combine outputs of the stacked main amplifier 702 and the parallel sub-amplifier 704. In this way, the same objective of using a parallel sub-amplifier for acquiring high power gain and low power consumption is achieved. The difference between the amplifier architectures in FIG. 1 and FIG. 7 is that the parallel sub-amplifier 704 is stacked with the stacked main amplifier 702, which means that the amplifier units 722, 714, and 712 share the same bias current. Compared to the amplifier architecture in FIG. 1, the amplifier architecture in FIG. 7 therefore has lower power consumption due to further current reuse. For clarity, an example is given as follows.

Figure 8:
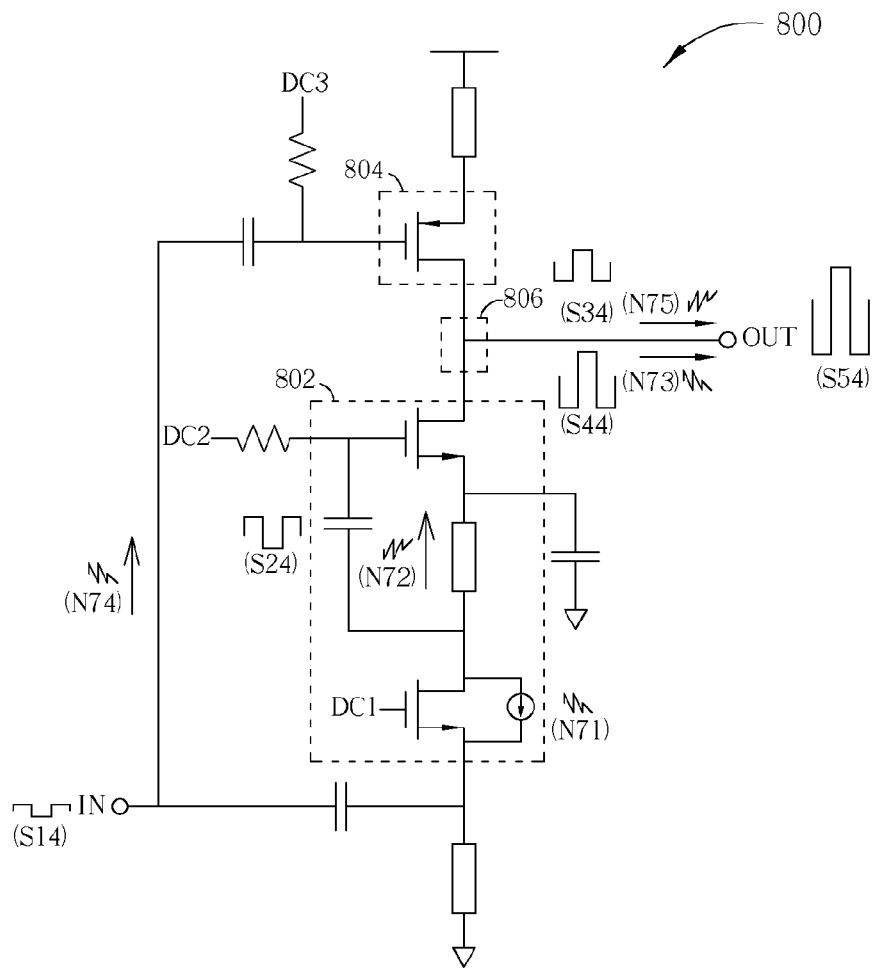
FIG. 8 is a circuit diagram illustrating an amplifier circuit having a stacked main amplifier and a sub-amplifier stacked with the stacked main amplifier according to a fifth embodiment of the present invention.

Please refer to FIG. 8. FIG. 8 is a circuit diagram illustrating an amplifier circuit having a stacked main amplifier and a sub-amplifier stacked with the stacked main amplifier according to a fifth embodiment of the present invention. After reading above disclosure, a person skilled in the art can readily understand that the amplified signal S24 and the input signal S14 are out of phase, while the amplified signals S34 and S44 generated from the parallel sub-amplifier 804 and the stacked main amplifier 802 respectively, and the input signal S14 received at the input node IN are in-phase. Additionally, as one can see, the noise signal N71 and the noise signal N72 are out of phase, the noise signal N71 and the noise signals N73 are in-phase, the noise signal N71 and the noise signal N74 are in-phase, and the noise signal N71 and the sensed noise signal N75 are out of phase. In this embodiment, the signal combiner 806 is directly implemented using interconnection of transmission lines coupled to outputs of the stacked main amplifier 802 and the parallel stacked sub-amplifier 804 respectively. After combining the output signals, including the amplified signals S34 and S44 and the noise signals N73 and N75, the noise signal N73 is suppressed by the sensed noise signal N75, while the amplified signal S44 is boosted by the amplified signal S34 to generate a resultant output signal S54 at the output node OUT.

It should be noted that the hardware configuration shown in FIG. 8 is for illustrative purposes only, and is not meant to be taken as a limitation of the present invention. Any modifications without departing from the spirit of the present invention are allowed to be made to the circuitry shown in FIG. 8. For example, the conception of having a sub-amplifier stacked with a stacked main amplifier can be implemented in any amplifier circuit having one stacked main amplifier with common-gate input stage or common-source input stage. These alternative designs all fall in the scope of the present invention. The disclosed amplifier circuit is not limited to be used in RF receiver, and can be applied to other fields or applications having a need for a low power, low noise, and high gain amplifier design. For example, the disclosed amplifier circuit could be applied to analog signal processing field, mixed-signal processing field, etc. Moreover, in above exemplary embodiments, single-ended amplifier circuits are illustrated for detailing features of the present invention. It should be noted that this is not meant to be a limitation of the present invention. The same noise suppression concept can be employed in a differential amplifier architecture, too. This alternative design also obeys the spirit of the present invention, and falls in the scope of the present invention. Those skilled in the art will readily observe that numerous modifications and alterations of the device and method may be made while retaining the teachings of the invention.

What is claimed is:

1. An amplifier circuit for amplifying an input signal to generate an output signal, comprising:
    a stacked main amplifier, comprising:
        a first amplifier unit, having an input node for receiving an input signal, and an output node for outputting a first amplified signal generated from processing the input signal; and
        a second amplifier unit, having an input node coupled to the output node of the first amplifier unit for receiving the first amplified signal, and an output node for outputting a second amplified signal generated from processing the first amplified signal, wherein the first amplifier unit and the second amplifier unit share bias current, and the first amplified signal and the bias current have different coupling paths;
    a parallel sub-amplifier, having an input node coupled to the input node of the first amplifier unit for receiving the input signal, and an output node for outputting a third amplified signal generated from processing the input signal; and
    a signal combiner, coupled to the output node of the second amplifier unit and the output node of the parallel sub-amplifier, for combining the second amplified signal and the third amplified signal to generate the output signal.

2. The amplifier circuit of claim 1, wherein the first amplifier unit comprises a first transistor having a control node, a first node serving as the output node of the first amplifier unit, and a second node serving as the input node of the first amplifier unit; and the parallel sub-amplifier comprises a second transistor having a control node serving as the input node of the parallel sub-amplifier, a first node coupled to the signal combiner, and a second node.

3. The amplifier circuit of claim 2, wherein the parallel sub-amplifier further comprises a feedback component electrically connected between the first node and the control node of the second transistor.

4. The amplifier circuit of claim 1, wherein the first amplifier unit comprises a first transistor having a control node serving as the input node of the first amplifier unit, a first node coupled to the control node and serving as the output node of the first amplifier unit, and a second node; and the parallel sub-amplifier comprises a second transistor having a control node, a first node coupled to the signal combiner, and a second node serving as the input node of the parallel sub-amplifier.

5. The amplifier circuit of claim 1, wherein the parallel sub-amplifier is a stacked sub-amplifier, comprising:
- a third amplifier unit, having an input node for receiving the input signal, and an output node for outputting a fourth amplified signal generated from processing the input signal; and
- a fourth amplifier unit, having an input node coupled to the output node of the third amplifier unit for receiving the fourth amplified signal, and an output node for outputting the third amplified signal generated from processing the fourth amplified signal, wherein the third amplifier unit and the fourth amplifier unit share bias current.

6. The amplifier circuit of claim 1, wherein the parallel sub-amplifier is stacked with the stacked main amplifier and shares bias current with the stacked main amplifier.

7. An amplifier circuit for amplifying an input signal to generate an output signal, comprising:
- a stacked main amplifier, comprising:
  - a first amplifier unit, having an input node for receiving an input signal, and an output node for outputting a first amplified signal generated from processing the input signal; and
  - a second amplifier unit, having an input node coupled to the output node of the first amplifier unit for receiving the first amplified signal, and an output node for outputting a second amplified signal generated from processing the first amplified signal, wherein the first amplifier unit and the second amplifier unit share bias current;
- a parallel sub-amplifier, having an input node coupled to the input node of the first amplifier unit for receiving the input signal, and an output node for outputting a third amplified signal generated from processing the input signal; and
- a signal combiner, coupled to the output node of the second amplifier unit and the output node of the parallel sub-amplifier, for combining the second amplified signal and the third amplified signal to generate the output signal;
- wherein the first amplifier unit comprises a first transistor having a control node, a first node serving as the output node of the first amplifier unit, and a second node serving as the input node of the first amplifier unit; and the parallel sub-amplifier comprises a second transistor having a control node serving as the input node of the parallel sub-amplifier, a first node coupled to the signal combiner, and a second node.

8. The amplifier circuit of claim 7, wherein the parallel sub-amplifier is a stacked sub-amplifier, comprising:
- a third amplifier unit, having an input node for receiving the input signal, and an output node for outputting a fourth amplified signal generated from processing the input signal; and
- a fourth amplifier unit, having an input node coupled to the output node of the third amplifier unit for receiving the fourth amplified signal, and an output node for outputting the third amplified signal generated from processing the fourth amplified signal, wherein the third amplifier unit and the fourth amplifier unit share bias current.

9. The amplifier circuit of claim 7, wherein the parallel sub-amplifier is stacked with the stacked main amplifier and shares bias current with the stacked main amplifier.

10. An amplifier circuit for amplifying an input signal to generate an output signal, comprising:
- a stacked main amplifier, comprising:
  - a first amplifier unit, having an input node for receiving an input signal, and an output node for outputting a first amplified signal generated from processing the input signal; and
  - a second amplifier unit, having an input node coupled to the output node of the first amplifier unit for receiving the first amplified signal, and an output node for outputting a second amplified signal generated from processing the first amplified signal, wherein the first amplifier unit and the second amplifier unit share bias current;
- a parallel sub-amplifier, having an input node coupled to the input node of the first amplifier unit for receiving the input signal, and an output node for outputting a third amplified signal generated from processing the input signal; and
- a signal combiner, coupled to the output node of the second amplifier unit and the output node of the parallel sub-amplifier, for combining the second amplified signal and the third amplified signal to generate the output signal;
- wherein the first amplifier unit comprises a first transistor having a control node serving as the input node of the first amplifier unit, a first node coupled to the control node and serving as the output node of the first amplifier unit, and a second node; and the parallel sub-amplifier comprises a second transistor having a control node, a first node coupled to the signal combiner, and a second node serving as the input node of the parallel sub-amplifier.

11. The amplifier circuit of claim 10, wherein the parallel sub-amplifier is a stacked sub-amplifier, comprising:
- a third amplifier unit, having an input node for receiving the input signal, and an output node for outputting a fourth amplified signal generated from processing the input signal; and
- a fourth amplifier unit, having an input node coupled to the output node of the third amplifier unit for receiving the fourth amplified signal, and an output node for outputting the third amplified signal generated from processing the fourth amplified signal, wherein the third amplifier unit and the fourth amplifier unit share bias current.

12. The amplifier circuit of claim 10, wherein the parallel sub-amplifier is stacked with the stacked main amplifier and shares bias current with the stacked main amplifier.

* * * * *